United States Patent
Liu et al.

(10) Patent No.: US 7,995,698 B2
(45) Date of Patent: Aug. 9, 2011

(54) METHOD FOR BINARY CLOCK AND DATA RECOVERY FOR FAST ACQUISITION AND SMALL TRACKING ERROR

(75) Inventors: Xin Liu, Shanghai (CN); Liang Zhang, Shanghai (CN); Yong Wang, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 874 days.

(21) Appl. No.: 11/906,004

(22) Filed: Sep. 28, 2007

(65) Prior Publication Data

US 2009/0086872 A1 Apr. 2, 2009

(51) Int. Cl.
*H03L 7/08* (2006.01)
*H03D 3/24* (2006.01)

(52) U.S. Cl. .......................... 375/376; 327/147; 327/156

(58) Field of Classification Search .................. 375/326, 375/327, 371, 373, 374, 376; 327/144–148, 327/151, 155–157, 160
See application file for complete search history.

(56) References Cited

U.S. PATENT DOCUMENTS

| 3,986,126 | A | * | 10/1976 | Gindi et al. | 327/166 |
|---|---|---|---|---|---|
| 5,056,118 | A | | 10/1991 | Sun | |
| 5,313,503 | A | * | 5/1994 | Jones et al. | 375/376 |
| 6,803,828 | B2 | * | 10/2004 | Tan et al. | 331/17 |
| 7,224,760 | B1 | * | 5/2007 | Rokhsaz et al. | 375/376 |
| 7,312,645 | B1 | * | 12/2007 | Brunn | 327/147 |
| 7,327,197 | B2 | * | 2/2008 | Kriz | 331/17 |
| 2004/0008804 | A1 | * | 1/2004 | Honken et al. | 375/375 |
| 2004/0232951 | A1 | * | 11/2004 | Tan et al. | 327/105 |
| 2007/0058768 | A1 | * | 3/2007 | Werner | 375/376 |
| 2007/0183552 | A1 | * | 8/2007 | Sanders et al. | 375/376 |

\* cited by examiner

*Primary Examiner* — Young T. Tse
(74) *Attorney, Agent, or Firm* — Hayes and Boone LLP

(57) ABSTRACT

A novel method and system for clock and data recovery in high speed serial transceiver applications allowing for fast bit lock acquisition and small data tracking error is presented. The clock and data recovery method utilizes a variable bandwidth loop filter to generate a phase adjustment signal used by a phase interpolator in generating a clock signal at the same frequency and phase as the incoming digital data stream. The loop filter bandwidth may be adjusted to correspond with a plurality of clock and data recovery operating modes. In particular, the filter bandwidth may be set to either a high or a low value depending on whether the phase difference between the recovered clock signal and the incoming digital data stream is above or below a programmed threshold value.

24 Claims, 6 Drawing Sheets

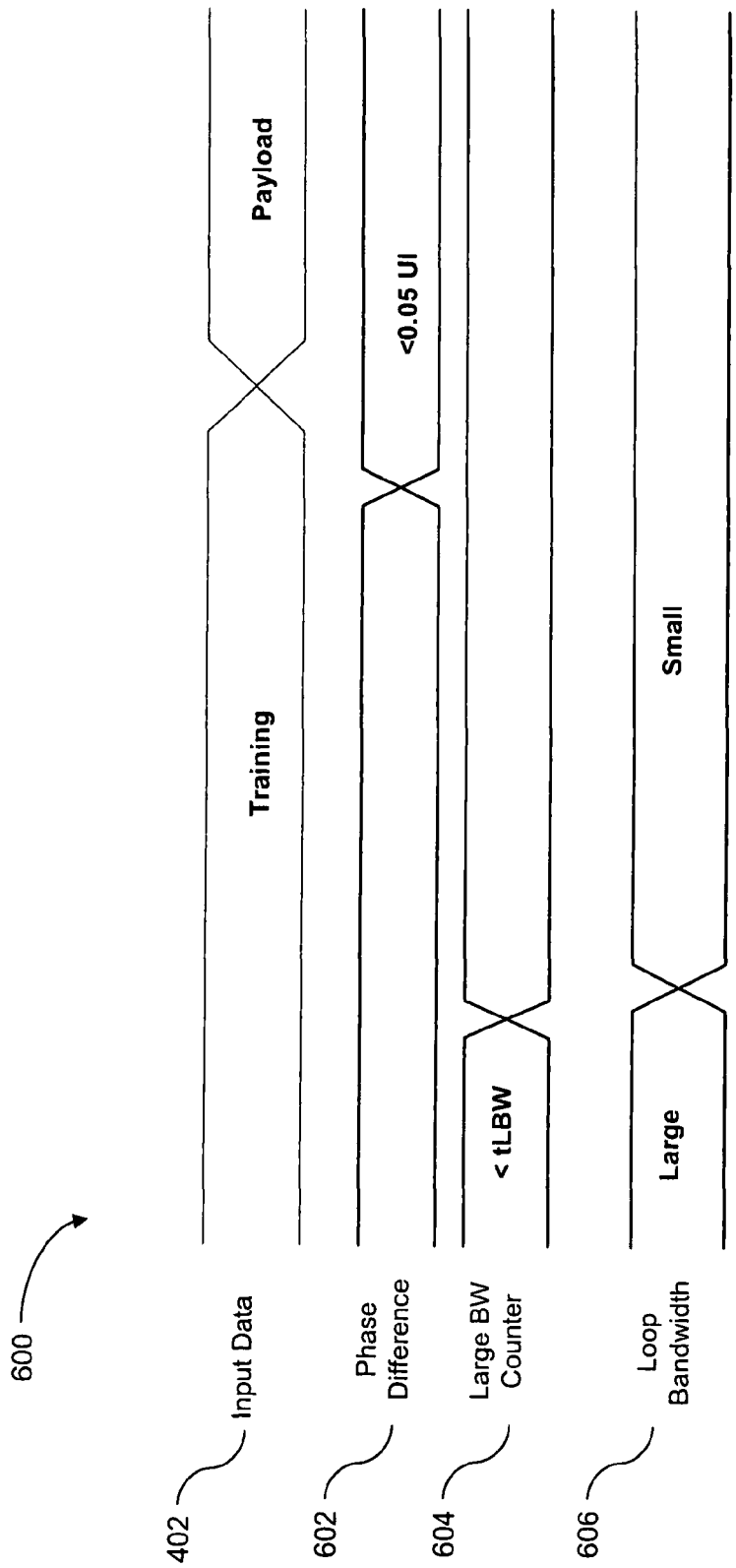

METHOD FOR BINARY CLOCK AND DATA RECOVERY FOR FAST ACQUISITION AND SMALL TRACKING ERROR

BACKGROUND

1. Field of the Invention

The present invention relates to serial data communication networks and, in particular, to a clock and data recovery method and system for use in serial data communication networks allowing for fast bit lock acquisition and small data tracking errors.

2. Discussion of Related Art

Modern high-speed serial transceivers have received wide application in cross-chip and serial data communication networks. In contrast to their parallel counterparts, high-speed serial transceivers have the capability of extracting a clock signal encoded within a received data stream, allowing for network synchronization over a single data channel. This capability has subsequently eliminated the requirement of sending data and synchronization clock signals over multiple channels. In addition, several parallel data channels may be multiplexed and transmitted through a single serial data channel, increasing data transmission rates. These methods eliminate the stringent requirements on skew control between clock and data signals present in parallel data communication networks, and greatly simplify overall system design.

Designing reliable clock and data recovery ("CDR") methods and systems, having the capability of extracting clock and data information contained within a transmitted serial data stream, proves crucial in the implementation of high-speed serial transceiver systems. A CDR system implemented in a high-speed serial transceiver may have multiple operating modes that depend on the state of an incoming input data stream. For example, during serial data link initialization before payload data is transmitted, data received by the serial transceiver may contain a CDR training data stream pattern. The training data stream may contain a synchronization clock signal embedded within rich data transitions in the data stream. By aligning an internal sampling clock to the embedded clock signal, the internal clock of the serial transceiver can be synchronized with the embedded clock signal. This process is called bit lock acquisition. Once bit lock is achieved, the serial transceiver may begin payload data transmission. Accordingly, due to inherent data transfer latencies during bit lock acquisition, reducing the time needed to achieve bit lock is a primary consideration in CDR system design.

During the transmission of payload data, the serial receiver must track minor phase changes in the incoming data. These minor phase changes are caused by a number of factors including system clock jitter and lane-to-lane interference. When left untracked by the CDR system, input data jitter can cause eye closure at sampling points and result in the overall degradation of system performance due to an increased bit error rate ("BER"). FIG. 1 illustrates the relationship between eye closure and BER graphically in graph 100. Two ideal digital pulses pdf(x) 104 without data jitter are shown centered one unit interval 110 apart. As illustrated in FIG. 1, one unit interval 110 represents the temporal spacing between adjacent bit intervals. A function illustrating the distribution of digital pulses with data jitter Cdf(x) 102 is also shown. The relationship between the distribution function Cdf(x) 102 and an ideal data pulse 104 is described by the relationship Cdf (0.1)=25, wherein as illustrated, 25% of pulse zero crossings will deviate from the ideal position by 0.1 unit intervals due to data jitter 108. As previously described, data jitter causes eye closure on both the left 106 and right 114 sides of the ideal digital pulse. A minimum eye opening 112 can be defined corresponding to a target BER. Thus, for a target BER, the total acceptable data jitter may be no greater than the sum of the left and right eye closures 106, 114 as shown. Accordingly, reducing tracking errors and BER is another primary consideration in designing CDR systems.

Therefore, in light of the foregoing description, it is desirable to develop novel and improved CDR systems with fast bit lock acquisition and small tracking error.

SUMMARY

In accordance with some embodiments of the present invention, a method of recovering a clock signal and a data signal from a digital data stream comprises sampling the digital data stream to generate a data signal, sampling the digital data stream to generate a data edge clock signal aligned with edge transitions of the digital data stream, generating a phase difference signal corresponding to the phase difference between the generated data signal and the data edge clock signal, setting the bandwidth of a loop filter based on set operating modes, generating a phase adjustment signal based on the phase difference signal, and generating a clock signal at the same frequency and phase of the digital data stream based on the phase adjustment signal.

In accordance with some embodiments of the present invention, a system for recovering a clock signal and a data signal from a digital data stream comprises at least one data input; a data edge transition sampler in communication with at least one of said data inputs; a data sampler in communication with at least one of said data inputs; a phase difference detector, in communication with at the data edge transition sampler and the data sampler, configured to generate a phase difference signal based on the output of the data edge transition sampler and the data sampler; a loop filter, in communication with the phase difference detector, configured to generate a phase adjustment signal based on the phase difference signal; a lock detector, in communication with the loop filter, configured to adjust the bandwidth of the loop filter based on set operating modes; and a phase interpolator, in communication with the output of the loop filter, configured to generate a clock signal at the same frequency and phase of the digital data stream using the phase adjustment signal.

Further embodiments and aspects of the invention are discussed with respect to the following figures, which are incorporated in and constitute a part of this specification.

BRIEF DESCRIPTION OF THE DRAWINGS

FIG. 6 illustrates a diagram showing signal levels in a CDR system according to some embodiments of the present invention, wherein the CDR system is in a programmable operating mode.

In the figures, elements having the same designation have the same or similar functions.

DETAILED DESCRIPTION

Figure 1:
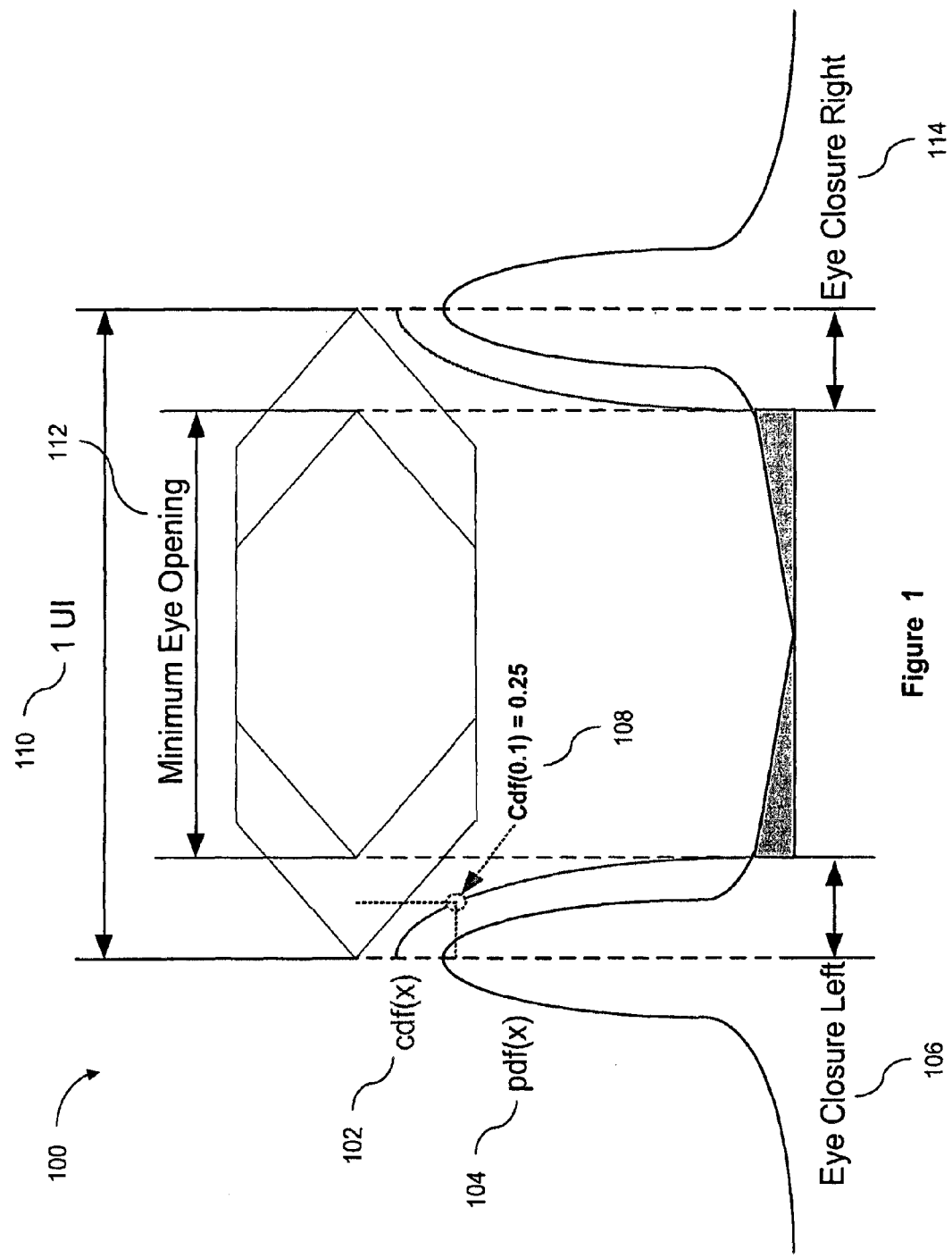
FIG. 1 is an illustration showing the relationship between eye closure and BER in a serial communication network with data jitter.
Figure 2:
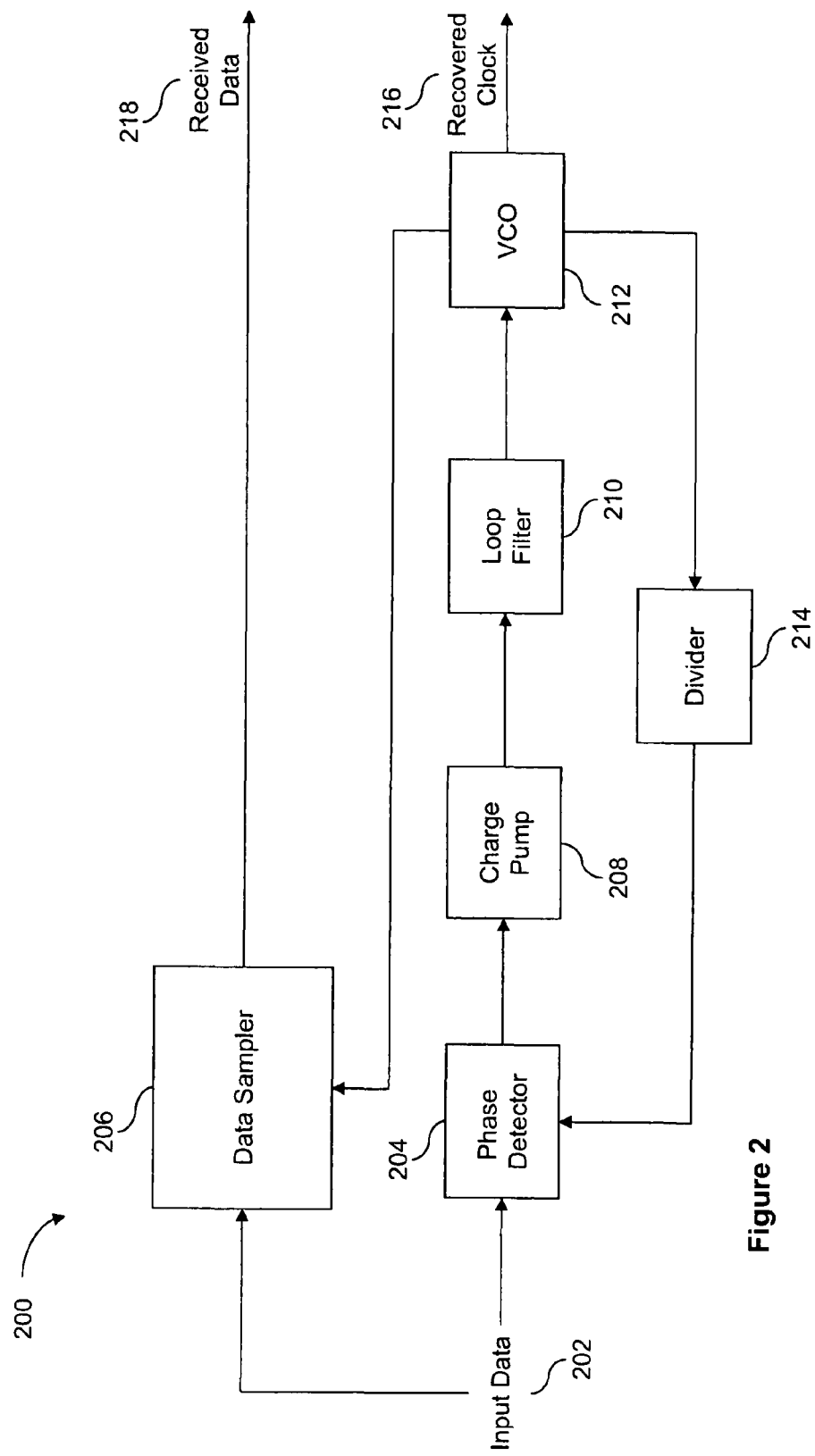
FIG. 2 illustrates a schematic block diagram of a CDR system implementing a PLL.

A CDR may utilize a phased lock loop ("PLL"), as is shown in FIG. 2. The PLL approach, shown in FIG. 2, has the capability of tracking phase errors caused by frequency shifts. As illustrated, the PLL based CDR system 200 comprises a phase detector 204, a data sampler 206, a charge pump 208, a loop filter 210, a voltage controller oscillator ("VCO") 212, and a frequency divider 214. An input data stream 202 enters the CDR system 200 and is coupled into the phase detector 204 and the data sampler 206. The phase detector 204 compares the relative phases of the input data stream 202 and the output of the VCO 212, frequency divided by a frequency divider 214, and directs the charge pump 208 to supply a voltage proportional to the detected phase difference. This voltage is then coupled into loop filter 210 and supplied to VCO 212, which adjusts its output frequency according to the supplied voltage. After the output signal from VCO 212 has been phase aligned with the input data stream 202, the recovered clock signal 216 output from VCO 212 may then be sent to data sampler 206 to generate a synchronized received data stream 218. The recovered clock signal 216 may also be used as an internal synchronization clock signal within the transceiver system.

There are several disadvantages, however, in utilizing a PLL for CDR. The PLL method requires a separate VCO for each serial bit lane, which is cumbersome to implement in multiple serial bit lanes on the same integrated circuit due to interference effects such as substrate crosstalk. In addition, bandwidth stability problems may arise if the loop bandwidth of the PLL is too wide. PLL bandwidth stability problems can be minimized by keeping the loop bandwidth small during the tracking process to reduce error. This, however, requires large on-chip capacitors to implement, which prove detrimental to device cost and layout area.

Figure 3:
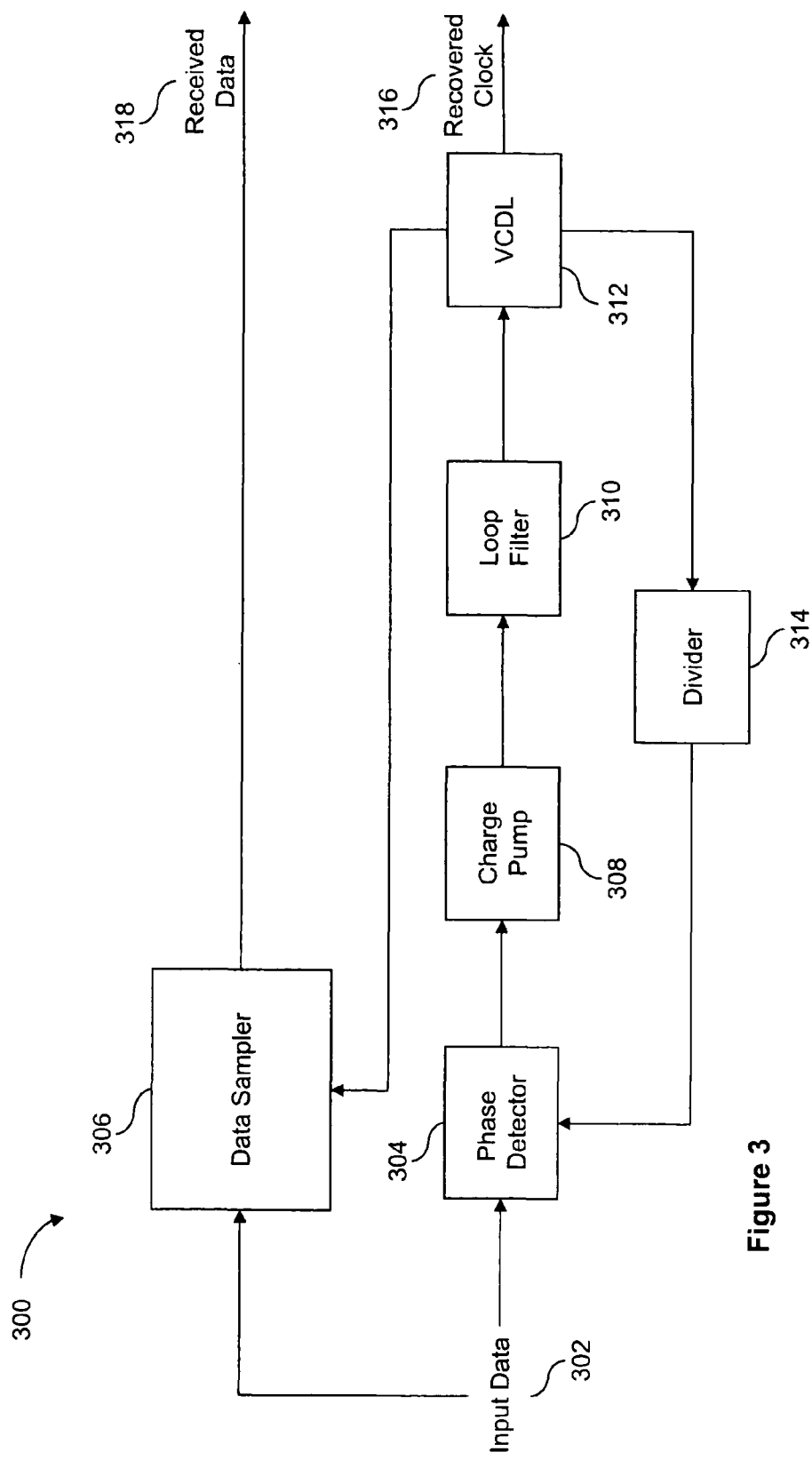
FIG. 3 illustrates a schematic block diagram of a CDR system implementing a DLL.

In contrast to the PLL method for CDR, a CDR system utilizing a delay locked loop ("DLL") does not require a VCO and lacks the stability issues plagued by the PLL method for CDR. FIG. 3 illustrates a schematic block diagram of a CDR system 300 utilizing a DLL comprising a phase detector 304, a data sampler 306, a charge pump 308, a loop filter 310, a voltage controlled delay line ("VCDL") 312, and a frequency divider 314. In the DLL based CDR approach illustrated in FIG. 3, an input data stream 302 enters the CDR system 300 and is coupled into the phase detector 304 and the data sampler 306. The phase detector 304 compares the relative phases of the input data stream 302 and the output of the VCDL 312, which is frequency divided in frequency divider 314, and directs the charge pump 308 to supply a voltage proportional to the detected phase difference. This voltage is then passed across a loop filter 310 and supplied to the VCDL 312. VCDL 312 phase aligns its output with the input data stream 302 based on the voltage supplied by charge pump 308. After the VCDL 312 output has phase aligned with the input data stream 302, the recovered clock signal 316 output from the VCDL 312 may then be sent to a data sampler 306 to generate a synchronized received data stream 318. The recovered clock signal 316 may also be used as an internal synchronization clock signal within the entire transceiver system. While the DLL approach to CDR boasts few bandwidth stability issues, it lacks the ability to track frequency changes. In addition, the DLL method is subject to performance issues relating to interactions between acquisition time, signal tracking, and phase shifting.

In accordance with some embodiments of the present invention, a method and system for CDR in high speed serial transceiver applications allowing for fast bit lock acquisition and small data tracking error is presented. Embodiments of the invention can be implemented in numerous ways, including methods and systems for performing CDR. In accordance with some embodiments of the invention, a method of CDR is presented wherein a digital data stream is sampled to generate sampled data and data edge clock signals. A phase difference signal is subsequently generated corresponding to the relative phase difference between the sampled signals. This phase difference signal is used by a variable bandwidth filter to generate a phase adjustment signal. The filter may implement both proportional and integral loop branches. The bandwidth of the filter may be adjusted to correspond with a plurality of CDR operating modes, which correspond to the relative phase difference between the sampled data signal and the data edge clock signal. In particular, the filter bandwidth may be set to either a high or a low value depending on whether the phase difference between the sampled signals is above or below a programmed threshold value. Finally, the phase adjustment signal is utilized by a phase interpolator to generate a clock signal at the same frequency and phase as the incoming digital data stream.

In accordance with some embodiments of the invention, a system can include a data input, a data edge transition sampler driven by a clock signal aligned with data edge transitions contained in a digital data stream, a data sampler driven by a clock signal aligned with the inverse of the clock signal aligned with data edge transitions contained in the digital data stream, a phase difference detector capable of generating a phase difference signal corresponding to the phase difference between the sampled data and the data edge clock signals, a variable bandwidth loop filter capable of using the phase difference signal to generate a phase adjustment signal, a lock detector capable of adjusting the bandwidth of the loop filter based on a plurality of CDR operating modes, and a phase interpolator capable of generating a clock signal the same frequency and phase of the incoming digital data stream using the phase adjustment signal.

Figure 4:
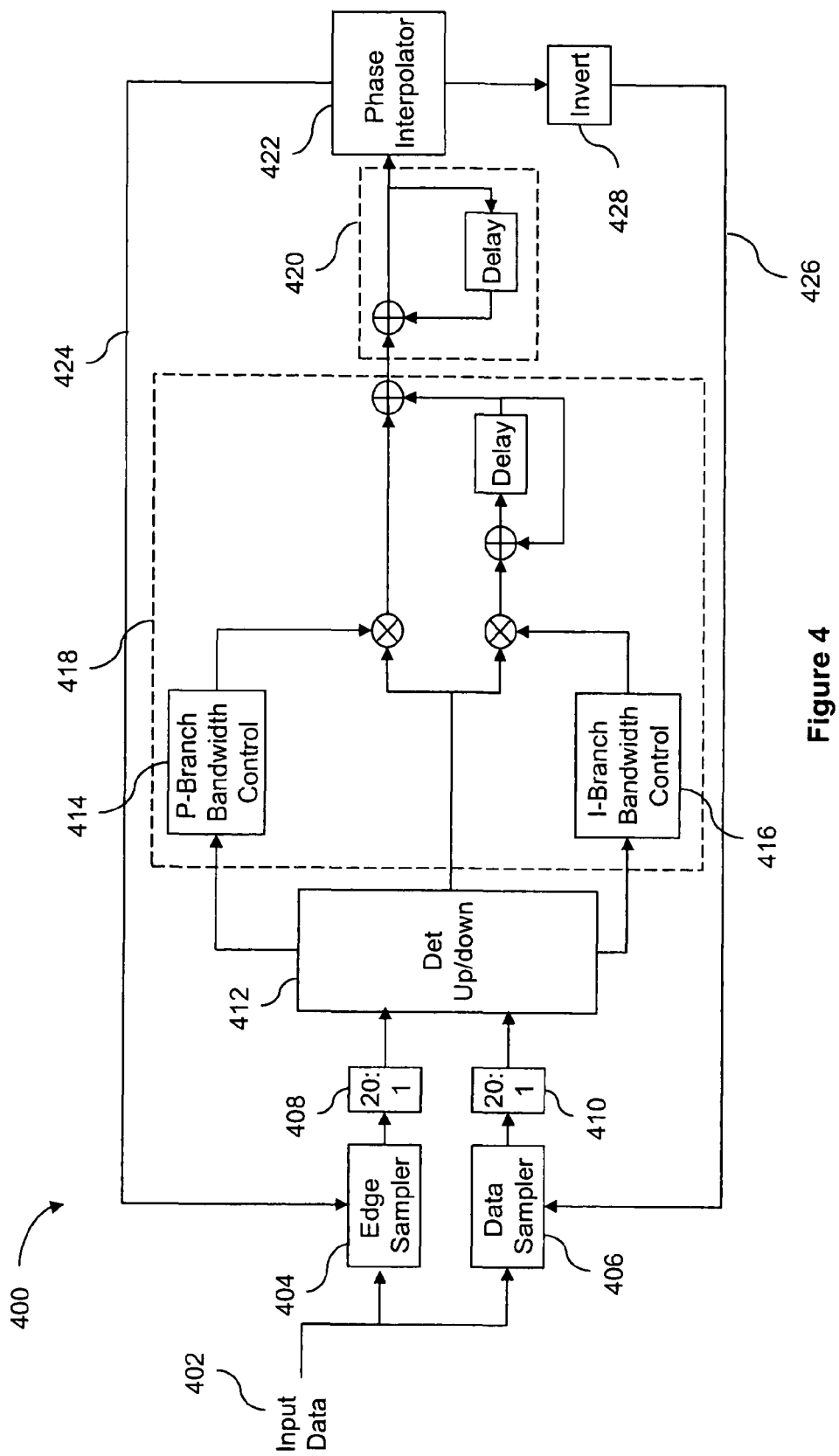
FIG. 4 illustrates a schematic block diagram of a CDR system in accordance with some embodiments of the present invention.

FIG. 4 illustrates a schematic block diagram of a CDR system 400 in accordance with some embodiments of the present invention. A digital data stream 402 is coupled into an edge transition sampler 404 and a data sampler 406. Edge transition sampler 404 is driven by a clock signal 424 that is edge aligned, as discussed below, with data edge transitions of the digital data stream 402. Data sampler 406 is driven by a clock signal 426 corresponding to the edge aligned clock signal 424 inverted in inverter 428.

After sampling of the digital data stream, the sampled data signal and data edge clock signal is coupled into de-multiplexers 408, 410 to separate any multiplexed data channels contained in the input data stream 402. De-multiplexers 408, 410, for example, may de-multiplex the sampled signals by a ratio of 20, as illustrated. De-multiplexers 408, 410 may be driven by select signals that are generated by counters at every 20 clock cycles of a clock signal received by the counters. In some embodiments, the counter used to generate the select signal to drive data edge clock signal de-multiplexer 208 may be driven by a clock signal that is shifted 180° from the clock signal received by the counter used to generate a select signal to drive sampled data de-multiplexer 210.

Phase difference detector 412 detects whether the data edge clock signal leads or lags the sampled data signal and generates a phase difference signal corresponding to the detected phase difference between the data edge clock signal and sampled data signal. Phase difference detector 412 may be implemented, for example, using a majority voter. In some embodiments, phase difference detector 412 may compare sampled data edge clock signal values with received and previously received sampled data signal values to determine a lead/lag phase relationship between the data edge clock signal and the sampled data signal. A phase difference signal may be generated based on the determined lead/lag phase relationship. For example, if the data edge clock signal leads the sampled data signal, a phase difference signal may be generated that indicates the data edge clock signal leads the sampled data signal. Similarly, if the data edge clock signal lags the sampled data signal, a phase difference signal may be generated that indicates the data edge clock signal lags the sampled data signal. If there is no detected lead/lag relationship, a signal indicating that the data edge clock signal and the sampled data signal are phase aligned may be generated.

The phase difference signal generated by phase difference detector 412 is subsequently passed to a variable bandwidth loop filter 418 and a loop lock detector 420. The loop lock detector 420 monitors the bit lock status of the variable bandwidth loop filter 418. Loop lock detector 420 may be implemented, for example, using a low pass filter. In some embodiments, loop lock detector 420 may utilize transition rich training data patterns received by the CDR system 400 during initialization. The transition rich training data pattern may contain repetitive header data patterns that are not sensitive to data jitter. By determining whether a specific number of consecutive header data patterns are received in a pre-defined time period, loop lock detector 420 may determine the lock status of variable bandwidth loop filter 418. For example, if loop lock detector 420 determines that a specified number of header data patterns occur within a pre-defined time period, bit lock has been achieved.

The variable bandwidth loop filter 418 generates a phase adjustment signal for use by a phase interpolator 422. Variable bandwidth loop filter 418 may include, for example, a proportional control branch 414 and integral control branch 416. In particular, by adding the capability of generating a control signal corresponding with minute frequency changes of the phase difference signal generated by phase difference detector 412, use of a integral control branch 416 within a variable bandwidth loop filter 418 allows for precise tracking of frequency changes of the input digital data stream. In some embodiments, the transfer function of the variable bandwidth loop filter 418 may be given by:

$$H(z)=Gp+Gi*z^{-1}$$

wherein Gp is the signal received from a proportional branch and Gi is the signal received from an integral branch.

The loop lock detector 420 monitors the bit lock status of the variable bandwidth loop filter 418 and adjusts the bandwidth of the variable bandwidth loop filter 418 according to predetermined CDR operating modes relating to the relative phase difference between the sampled data signal and the data edge clock signal. For example, the loop lock detector 420 may adjust the variable bandwidth loop filter 418 bandwidth to a large filter bandwidth setting when the relative phase difference between the sampled data signal and the data edge clock signal is above a programmed threshold value. This operating mode may be implemented during CDR system initialization (i.e., during bit lock acquisition training). In another example, the loop lock detector 420 may adjust the variable bandwidth loop filter 418 bandwidth to a small filter bandwidth setting when the relative phase difference between the sampled data signal and the data edge clock signal is below a programmed threshold value. This operating mode may be implemented after data bit lock has been achieved and during payload data transmission. Finally, in another example, the variable bandwidth loop filter 418 bandwidth may be adjusted at pre-defined time intervals. The bandwidth of variable bandwidth loop filter 418 may be adjusted by loop lock detector 420 by changing the proportional control branch 414 gain and the integral control branch 416 gain of variable bandwidth loop filter 418 to a set of pre-defined values corresponding with a variable bandwidth loop filter 418 bandwidth for a pre-determined CDR operating mode.

Based on the phase adjustment signal generated by the variable bandwidth loop filter 418, the phase interpolator 422 generates a clock signal 424 at a frequency and phase which is near the same frequency and phase of the digital data stream 402. In some embodiments, the output signal 424 of the phase interpolator 422 may be given by:

$$Pi(n)=Pi(n-1)+If(n)$$

wherein Pi is the previous output clock signal phase of the phase interpolator 426, If is the output of the variable bandwidth loop filter 418, and n is an incrementing counter value.

Figure 5:
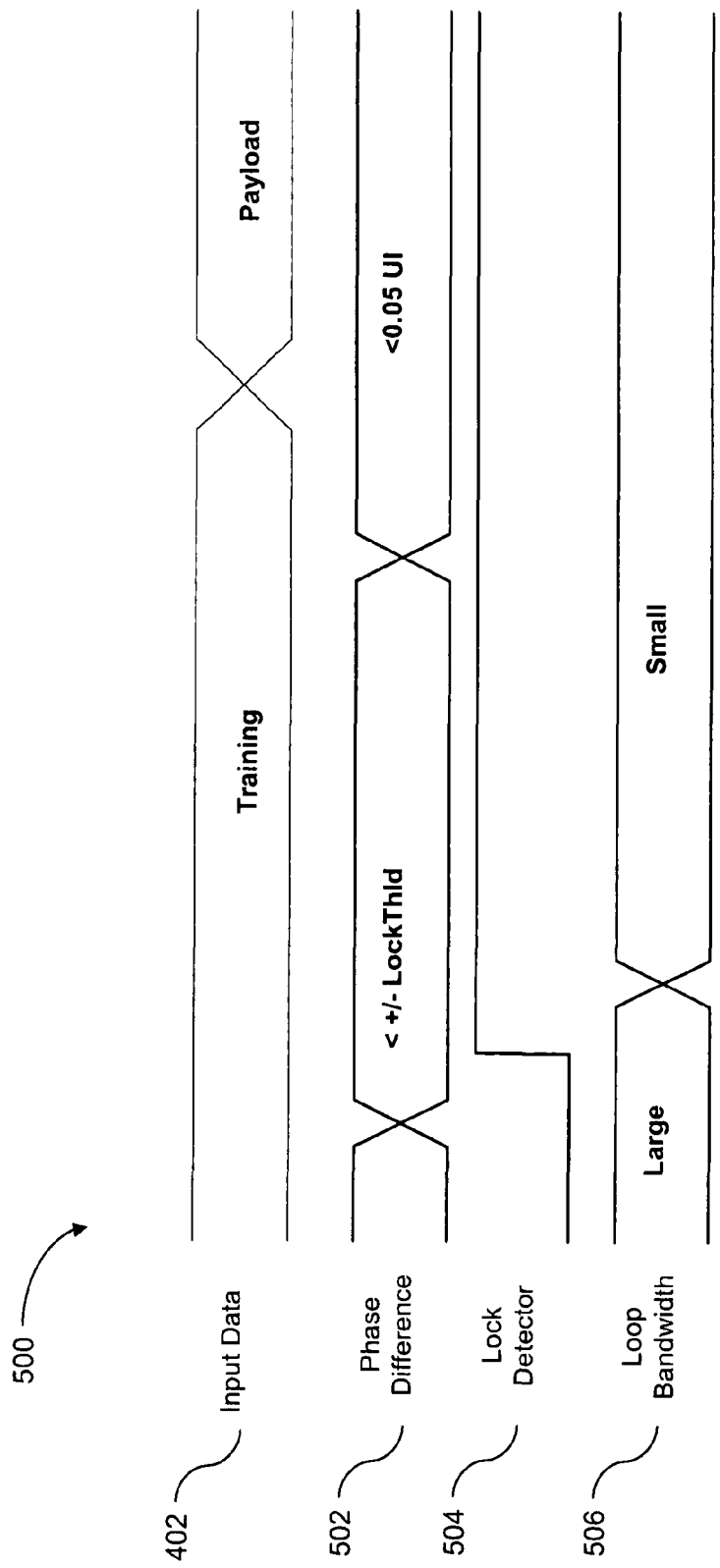
FIG. 5 illustrates a diagram showing signal levels in a CDR system according to some embodiments of the present invention, wherein the CDR system is in a default operating mode.

FIG. 5 illustrates a diagram 500 showing signal levels 402, 502-506 in a CDR system 400 according to some embodiments of the present invention, wherein the CDR system 400 is in a default operating mode allowing for automatic bandwidth control of the variable bandwidth loop filter 418. After CDR system reset and during input data 402 training, the variable bandwidth loop filter 418 bandwidth is adjusted to a large bandwidth setting 506. Once bit lock has been obtained (i.e., the relative bandwidth between the embedded clock signal in the input data and in the recovered clock signal in the CDR system 400 reach a specific programmable threshold value), the loop lock detector 420 adjusts 504 the loop bandwidth 506 to a smaller value, thereby reducing input data 402 tracking error. The small loop bandwidth 506 is used by the CDR system 400 while receiving payload input data 402 and does not reset until the next CDR system 400 training input data stream 402 is initiated. The values of the large and small loop bandwidth may be determined according to several factors, including specified bit lock acquisition time and steady state tracking error requirements.

FIG. 6 illustrates a diagram 600 showing signal levels 402, 602-606 in a CDR system 400 according to some embodiments of the present invention, wherein the CDR system 400 is in a programmable operating mode. The specific operating mode illustrated corresponds with a predefined large loop bandwidth 606 duration. This operating mode may be implemented in instances where the internal lock detector 420 used to adjust the bandwidth 606 of the loop filter 418 is disabled. Particularly, in this mode, a counter signal 604 is implemented to regulate the predefined duration of the large loop bandwidth 606 setting. For example, the duration of the large loop bandwidth 606 may correspond to a duration which is less than the overall CDR input data 402 training period, but long enough to achieve bit lock acquisition 602 before transmission of payload data 402 begins, as illustrated.

Other embodiments of the invention will be apparent to those skilled in the art from consideration of the specification and practice of the invention disclosed herein. It is intended that the specification and examples be considered as exemplary only, therefore, the invention is limited only by the following claims.

What is claimed is:
1. A method of recovering a clock signal and a data signal of a digital data stream, the method comprising:
sampling said digital data stream to generate a sampled data signal;

sampling said digital data stream to generate a data edge clock signal aligned with edge transitions of the digital data stream;

generating a phase difference signal corresponding to the phase difference between the sampled data signal and the data edge clock signal;

generating, by a loop filter, a phase adjustment signal based on the phase difference signal;

adjusting the bandwidth of the loop filter based on predetermined operating modes; and generating the clock signal at the same frequency and phase of the digital data stream based on the phase adjustment signal.

2. The method of claim 1, wherein sampling said digital data stream to generate the sampled data signal is driven by a clock signal that is the inverse of said generated clock signal at the same frequency and phase of the digital data stream.

3. The method of claim 1, wherein sampling said digital data stream to generate the data edge clock signal is driven by said generated clock signal at the same frequency and phase of the digital data stream.

4. The method of claim 1, wherein generating the phase difference signal is performed by a phase difference detector.

5. The method of claim 1, wherein generating the phase difference signal includes:
de-multiplexing the sampled data signal and the data edge clock signal; and
determining whether the sampled data signal leads or lags the data edge clock signal.

6. The method of claim 5, wherein the sampled data signal and the data edge clock signal are de-multiplexed by a ratio of 20.

7. The method of claim 5, wherein determining whether the sampled data signal leads or lags the data edge clock signal is performed by a majority voter.

8. The method of claim 1, wherein adjusting the bandwidth of the of loop filter is performed using a loop lock detector.

9. The method of claim 8, wherein said loop lock detector includes a low pass filter.

10. The method of claim 1, wherein said operating modes are based on the relative phase difference between the sampled data signal and the data edge clock signal.

11. The method of claim 10, wherein said operating modes include an operating mode corresponding to a large loop filter bandwidth setting when the relative phase difference between the sampled data signal and the data edge clock signal is above a programmed threshold value.

12. The method of claim 10, wherein said operating modes include an operating mode corresponding to a small loop filter bandwidth setting when the relative phase difference between the sampled data signal and the data edge clock signal is below a programmed threshold value.

13. The method of claim 1, wherein said loop filter includes a proportional control branch and an integral control branch.

14. A system for recovering a clock signal and a data signal of a digital data stream, the system comprising:

at least one data input for carrying the digital data stream;
a data edge transition sampler in communication with the at least one data input;
a data sampler in communication with the at least one data input;
a phase difference detector in communication with the data edge transition sampler and the data sampler, configured to generate a phase difference signal based on the outputs of the data edge transition sampler and the data sampler;
a loop filter in communication with the phase difference detector, configured to generate a phase adjustment signal based on the phase difference signal;
a lock detector in communication with the loop filter, configured to adjust the bandwidth of the loop filter based on predetermined operating modes; and
a phase interpolator in communication with the output of the loop filter, configured to generate the clock signal at the same frequency and phase of the digital data stream using the phase adjustment signal.

15. The system of claim 14, wherein said data edge transition sampler is driven by said generated clock signal at the same frequency and phase of the digital data stream.

16. The system of claim 14, wherein said data sampler is driven by the inverse of said generated clock signal at the same frequency and phase of the digital data stream.

17. The system of claim 14, further including a signal de-multiplexer in communication with either the data edge transition sampler or the data sampler and the phase difference detector.

18. The system of claim 17, wherein the signal de-multiplexer has the capability of de-multiplexing the sampled signals of the data edge transition sampler and the data sampler by a ratio of 20.

19. The system of claim 14, wherein the phase difference detector includes a majority voter configured to determine whether the output of the data sampler leads or lags the output of the data edge transition sampler.

20. The system of claim 14, wherein the loop filer includes a proportional control branch and an integral control branch.

21. The system of claim 14, wherein the lock detector includes a low pass filter.

22. The system of claim 14, wherein said operating modes are based on the relative phase difference between the outputs of the data sampler and the data edge transition sampler.

23. The system of claim 14, wherein said operating modes include an operating mode corresponding to a large loop filter bandwidth setting when the relative phase difference between the outputs of the data sampler and the data edge transition sampler is above a programmed threshold value.

24. The system of claim 14, wherein said operating modes include an operating mode corresponding to a small loop filter bandwidth setting when the relative phase difference between the outputs of the data sampler and the data edge transition sampler is below a programmed threshold value.

* * * * *